United States Patent
Munk et al.

(10) Patent No.: US 6,780,293 B2
(45) Date of Patent: Aug. 24, 2004

(54) FLOATABLE SANITIZER APPARATUS

(76) Inventors: Dell R. Munk, 5353 E. Dolphin, Mesa, AZ (US) 85206; Stanley S. Munk, 28120 234th Ave. SE., Maple Valley, WA (US) 98038

( * ) Notice: Subject to any disclaimer, the term of this patent is extended or adjusted under 35 U.S.C. 154(b) by 139 days.

(21) Appl. No.: 10/027,738

(22) Filed: Dec. 21, 2001

(65) Prior Publication Data

US 2002/0078990 A1 Jun. 27, 2002

Related U.S. Application Data

(60) Provisional application No. 60/257,874, filed on Dec. 21, 2000.

(51) Int. Cl.[7] .............................. C25B 9/00; C25C 7/00
(52) U.S. Cl. ................ 204/272; 204/230.2; 204/230.5; 204/230.6; 204/DIG. 3
(58) Field of Search .............................. 204/272, 230.2, 204/230.5, 230.6, DIG. 3

(56) References Cited

U.S. PATENT DOCUMENTS 4,337,136 A * 6/1982 Dahlgren .................... 204/242
5,059,296 A * 10/1991 Sherman .................. 204/229.8

* cited by examiner

Primary Examiner—Wesley A. Nicolas
(74) Attorney, Agent, or Firm—Kunzler & Associates

(57) ABSTRACT

A floatable sanitizer employs a plurality of electrodes to contact a body of water in order to achieve a near maintenance-free sanitizing chemical generator. In one embodiment, the sanitizing chemical is chlorine and the chlorine is generated by an electrolytic process. The electrolytic reaction may be powered by photovoltaic cells, making the apparatus self-contained and able to float freely within a body of water. In one embodiment, the energy source is channeled through a polarity-reversing module. The polarity-reversing module alternates the direction of the current generated by the photovoltaic cells at a predetermined time interval. The reversing of the polarity reduces scale build-up and prevents corrosion of the metal electrodes.

21 Claims, 5 Drawing Sheets

FLOATABLE SANITIZER APPARATUS

This application claims the benefit of a provisional application No. 60/257,874 filed Dec. 21, 2000

BACKGROUND OF THE INVENTION

1. The Field of the Invention

The invention relates to water treatment by generation of sanitizing chemicals and more particularly to novel systems utilizing a floating apparatus for the electrolytic generation of chlorine.

2. The Relevant Art

Water has always presented an attractive environment for bacteria and viruses. The water used in swimming pools, spas, hot tubs, etc., is no different. In addition to fostering an ideal environment for bacteria and viruses, pool water may start to change color. Microscopic plants spread by airborne spores may cause this change in color. The presence of these microorganisms make themselves known by causing infection and disease. Not only can these microorganisms be the cause of infection and disease, but the microorganisms can also be the source of burning and irritation to the skin and eyes, which is caused by an unbalanced pH level as the organisms absorb nutrients from the water.

In order to control these organisms and maintain appropriate pH levels, chemicals including chlorine, bromine, and natural compounds have been used. These chemicals dissolve in water, forming hypochlorous acid or free chlorine. This free chlorine is able to penetrate the cell walls of microorganisms eliminating them from the water. Many methods are available to implement this type of chemical water purification system. Traditional purification systems used on swimming pools and in related applications can require a great amount of training and practice to properly maintain. The chemicals used in these systems can also pose certain dangers and can also represent a significant amount of the cost of maintaining the pool. Some methods of sanitization include chemical release devices, chemical shock treatment, in-line chemical filtration systems, and electrolytic chemical generation systems.

The method of choice among consumers depends on many variables but most importantly the choice hinges around cost and maintenance. Chemical release devices routinely require the attention of the consumer in order to maintain the appropriate levels of chemicals within the device. Chemical shock treatments can be hazardous, because as large amounts of chemicals are introduced into the water feature (i.e., pool, spa, hot tub, fountain, etc.) noxious gases may be generated. Additionally, the chemical shock treatment requires the concentration of the chemical to decrease over a period of time before the pool, spa, etc., may be used. In-line chemical filtration systems are costly, and most often must be installed underground.

The electrolytic process has for many years been a basis for generation of chlorine. Electricity passing between a cathode and an anode in a salt (NaCl) and water solution cause molecules to split. Na (sodium) floats in the water until it can re-attach itself with a free chloride. The chloride atom is charged from the reaction, and while some of the chloride atoms escape, others are converted to chlorine. This process offers advantages over the previously discussed methods. First, salt is present in most water supplies. If no salt is present, only a small amount of salt is required because the reaction produces salt as a byproduct. Second, chlorine is being generated at a slow natural pace, not by bulk or shock treatment, thereby eliminating the need to purchase and transport hazardous chemicals.

Current electrolytic sanitizing devices also have limitations. These devices require electricity and therefore must be installed within the filtration system, which increases the cost of the device. The electrodes that supply the electricity have a tendency to develop a scale buildup, which requires periodic cleanings.

Solutions for improving electrolytic sanitizing systems are needed. Among these solutions, a self-contained, floatable device would be a great improvement in the art. Additionally, the ability of the device to generate the power required to drive the electrolytic process would be helpful, as would the ability to prevent chemical accumulation on the electrodes.

OBJECTS AND BRIEF SUMMARY OF THE INVENTION

The chemical generator of the present invention has been developed in response to the present state of the art, and in particular, in response to the problems and needs in the art that have not yet been fully solved by currently available sanitizing chemical generators. Accordingly, it is an overall object of the present invention to provide a sanitizing chemical generator that overcomes many or all of the above-discussed shortcomings in the art.

To achieve the foregoing object, and in accordance with the invention as embodied and broadly described herein in the preferred embodiments, an improved sanitizing chemical generator is provided and configured with a buoyant enclosure, a plurality of electrodes, a power source, and a polarity reversing module. Upper and lower buoyant composite plastic housings may form the buoyant enclosure.

The electrodes of the sanitizing chemical generator preferably comprise a plurality of at least two electrodes. Alternatively, the apparatus may be configured to contain any number of electrodes seen fit to generate the desired amount of chemicals. Under a preferred embodiment of the present invention, each of the plurality of electrodes comprises a metal coated with an oxidizer layer in order to resist the formation of scale, and prevent corrosion.

In one embodiment, the power source of the chemical generator comprises a replaceable power supply such as a battery or batteries. Alternatively, the power source may comprise a renewable power supply. Under a preferred embodiment of the present invention, the power supply comprises photovoltaic solar panels. The sanitizing chemical generator is preferably configured to float freely within a body of water.

The polarity-reversing module is configured to alternate the polarity of the electrodes at a predetermined time interval. The polarity prevents chemical buildup on the electrodes.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
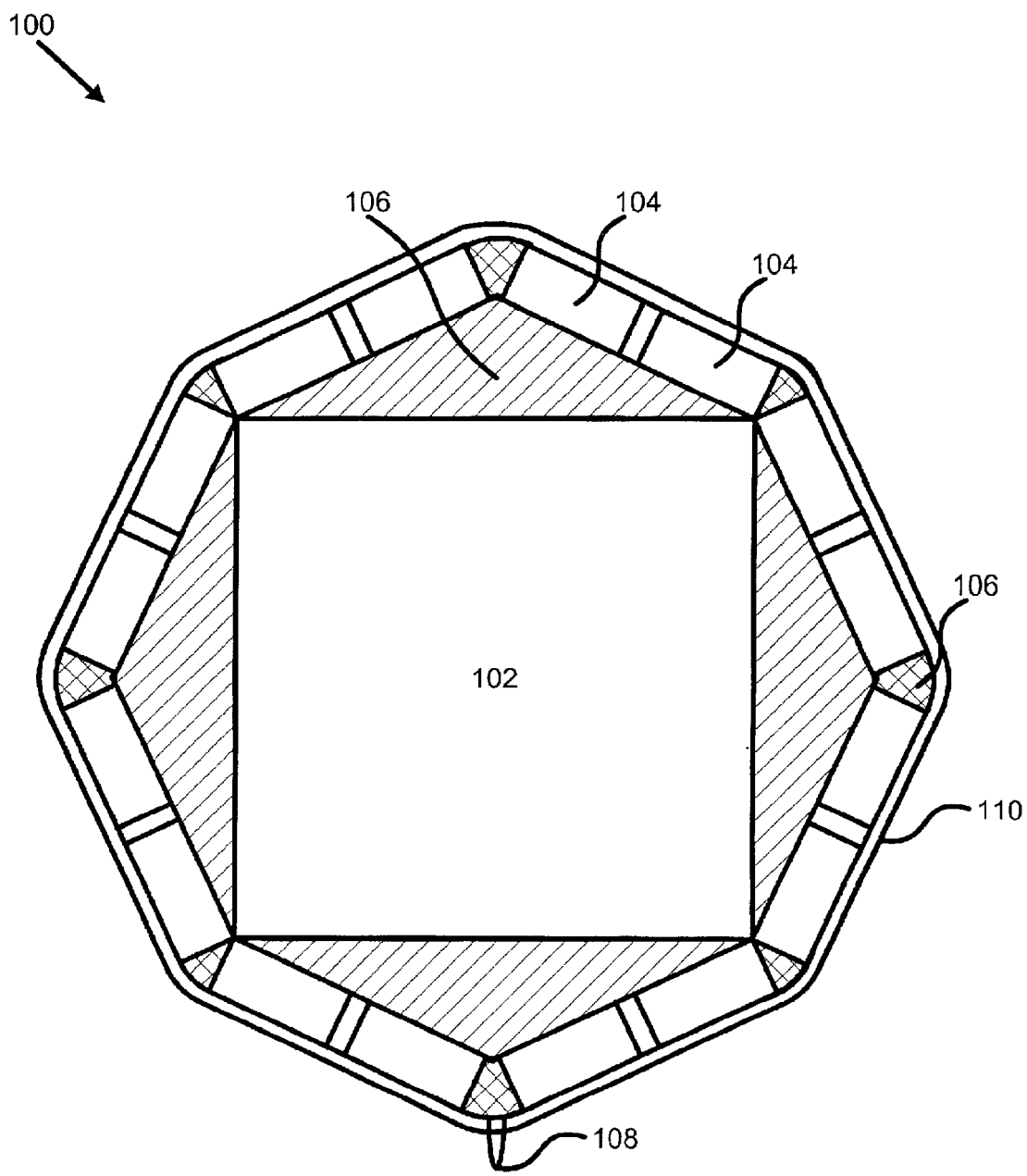
FIG. 1 is a top perspective view illustrating the structure of a floatable sanitizer apparatus of the present invention.

Shown in FIG. 1 is a top view of a sanitizing apparatus 100 of the present invention. In one embodiment, the apparatus 100 comprises a central solar panel 102, a plurality of side solar panels 104, a buoyant material 106, a tether device 108, and a protective outer ring 110. The solar cells 102 and 104 are configured in such a way as to generate sufficient power as to drive an electrolytic reaction. Under a preferred embodiment of the present invention, the solar panels 102 and 104 convert the sun's energy into direct current (DC) electricity that is regulated to a voltage in a preferred range of between about 6–7 DC volts and a current of about 4–6 amperes. Alternatively, the solar panels 102 and 104 may be replaced with any suitable power source for generating the required voltage and amperage, including batteries, an AC power source, and fuel cells.

In one embodiment, the buoyant material 106 is comprised of a floatable composite plastic. In alternative embodiments, the buoyant material 106 may comprise any suitable material, including wood and polystyrene. The sanitizing apparatus 100 is designed to be free-floating within a water feature. This free-floating design allows for a natural and gentle chemical generation process, versus a possibly hazardous shock treatment when chemicals are introduced suddenly to the body of water.

Under a preferred embodiment of the present invention, the water feature may be a swimming pool, spa, hot tub, or commercial water fountain. The tether device 108 may be attached at any point along the perimeter of the sanitizing device 100. The tether device 108 enables the sanitizing apparatus 100 to maintain a stationary position within the water feature. A protective outer ring 110 is also provided to shield the solar panels 102 and 104. As used herein, the use of a tether is still included within the definition of "free floating," as the tether does not prevent the sanitizing device 100 from moving around in the body of water. Of course, the tether may also be dispensed with in some embodiments.

Under the embodiment of FIG. 1, the sanitizing apparatus 100 is illustrated as an octahedral-shaped enclosure. A polyhedral shape is preferred in order to facilitate the rectangular architecture of the solar panels 102 and 104. In one embodiment, the solar panels 104 comprise a plurality of eight solar panels. Of course, the plurality of solar panels 104, as with the number of sides, may comprise any number.

Figure 2:
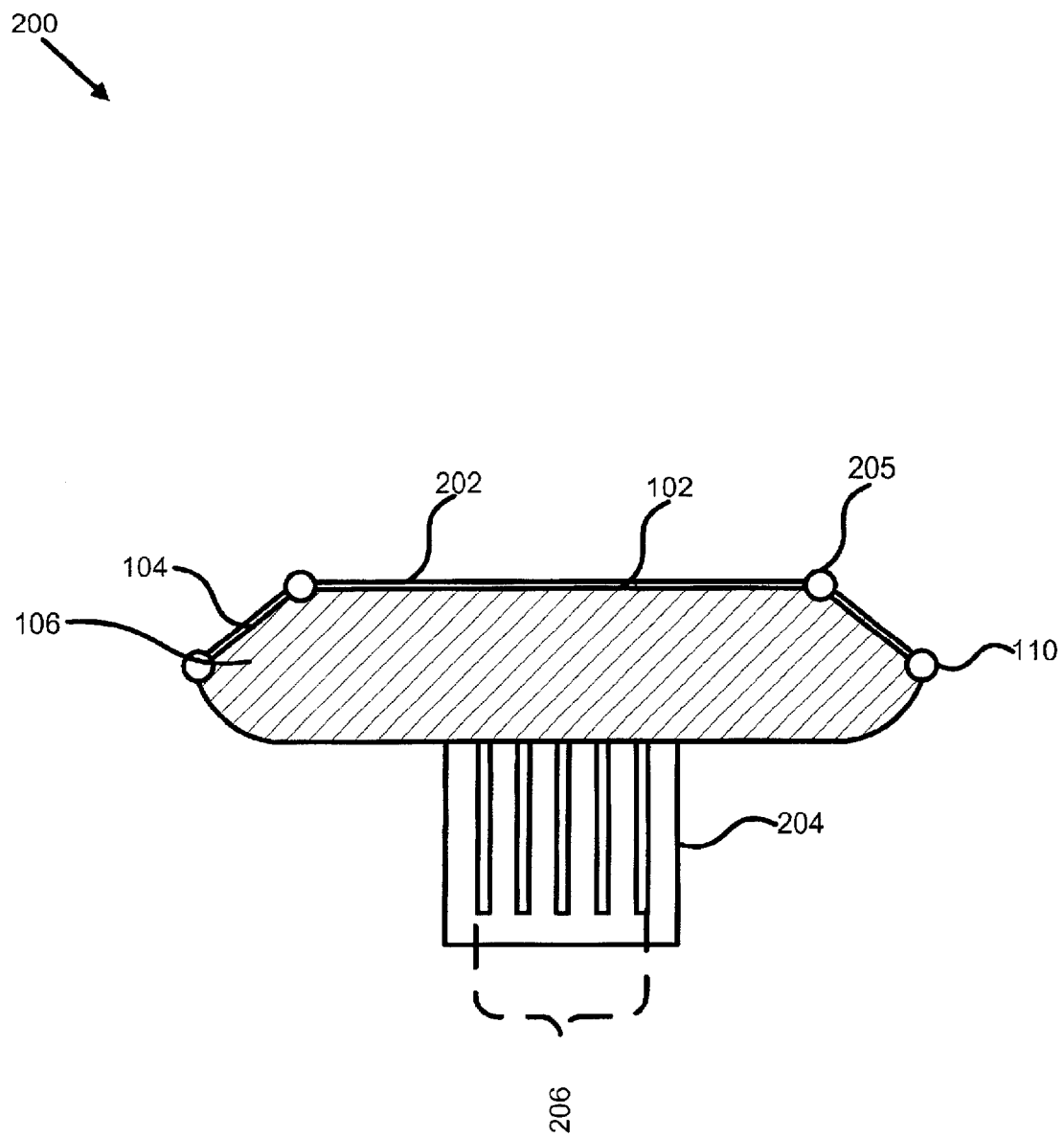
FIG. 2 is a side perspective view illustrating the structure of the floatable sanitizer apparatus of FIG. 1.

FIG. 2 is a side view of the sanitizing apparatus 200. Shown therein are the central solar panel 102, the plurality of side solar panels 104, the buoyant material 106, and the protective outer ring 110 as described above with reference to FIG. 1. Under a preferred embodiment of the present invention, the side solar panels 104 are positioned upon an incline. This incline enables the solar panels 104 to more efficiently capture solar energy. In one embodiment this incline is 45°. More generally, the incline is preferably within a range of between about 30° and 45°.

Also depicted are a protective layer 202, an electrode screen 204, a protective bead 205, and a plurality of electrodes 206. In one embodiment, the protective layer 202 is a film that encases the solar panels 102 and 104 in order to prevent damage. Under a preferred embodiment of the present invention, the protective layer 202 comprises a thin layer of liquid silicone. Alternatively, the protective layer 202 may comprise any suitable material that allows the sun's energy to pass to the solar panels while protecting the solar panels.

In one embodiment, the electrode screen 204 comprises a buoyant material such as a composite plastic. The electrode screen 204 is porous to enable the electrodes 206 to make contact with water. In a further embodiment, the electrode screen 204 is configured to be removable to allow for the introduction of a small amount of salt. Under a preferred embodiment of the present invention, the plurality of electrodes 206 comprises a plurality of at least two electrodes. Alternatively, the plurality of electrodes 206 may comprise any number of electrodes required to generate sufficient chemicals for the sanitizing of the specified water feature. The individual electrodes within the plurality of electrodes 206 are preferably constructed of titanium with a baked-on oxidizer coating such as platinum. Alternatively, the electrodes may comprise any combination of metal and oxidizer coating that enhances the performance of the sanitizing apparatus 200.

Figure 3:
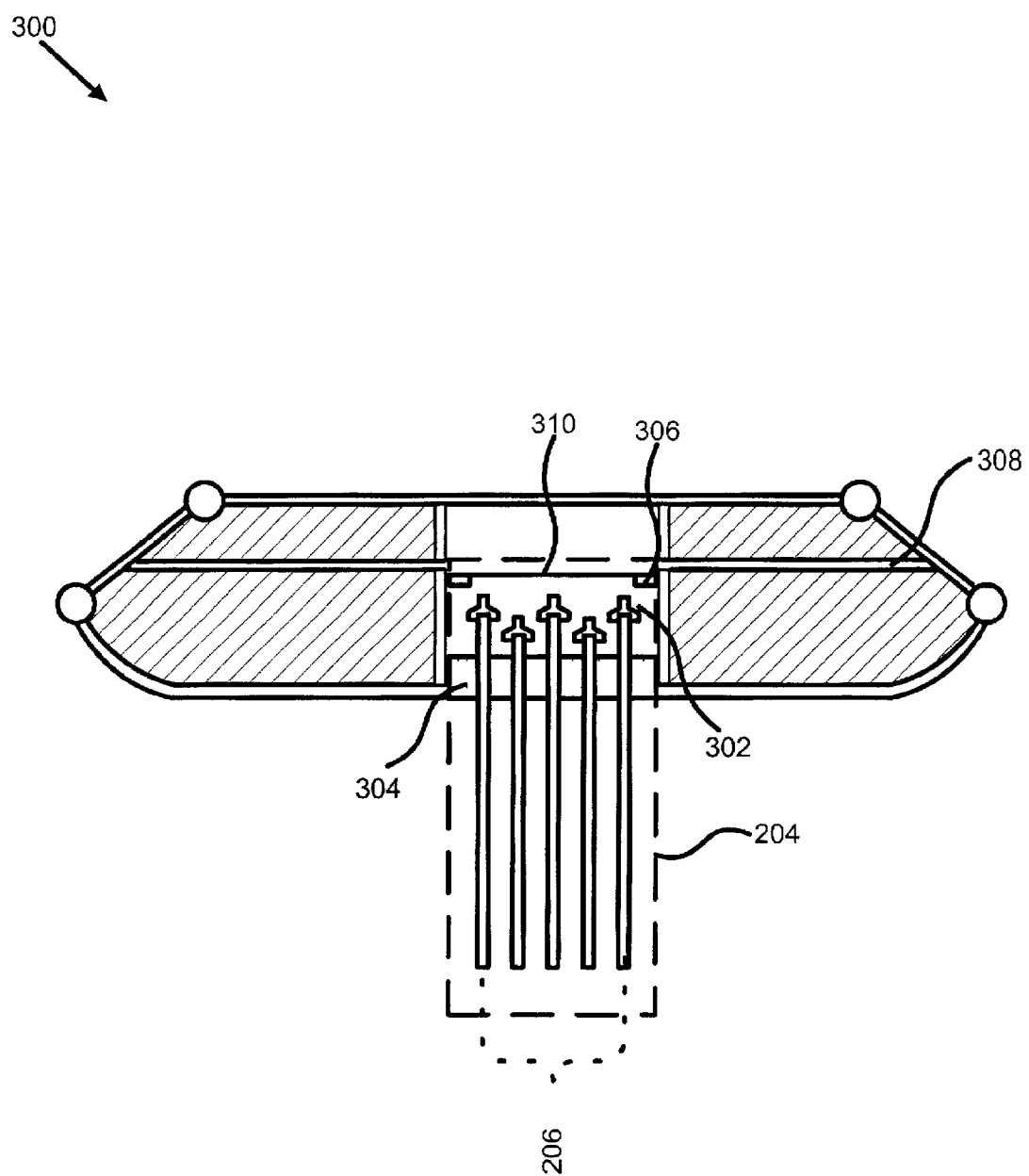
FIG. 3 is a cross-sectional perspective view illustrating the structure of a floatable sanitizer apparatus in accordance with one embodiment of the present invention.

Shown in FIG. 3 is a cross-sectional view illustrating the structure of the floatable sanitizing apparatus 300. In one embodiment, the floatable sanitizing apparatus 300 comprises the electrode screen 204 and the plurality of electrodes 206 as described above with reference to FIG. 2. Also depicted are electrical connectors 302, a hub section 304, a support ledge 306, an electrical channel 308, and a polarity-reversing module 310 (contained substantially within a circuit board in one embodiment). Under a preferred embodiment of the present invention, the electrical connectors 302 comprise stainless steel wire connectors. Alternatively, any connection that provides the corrosion resistant connection desired may be utilized for the electrical connectors 302.

A hermetic seal is provided by the hub section 304. In one embodiment, the hub section 304 comprises a composite plastic injection to seal around the plurality of electrodes 206. The support ledge 306 provides a basis upon which the polarity-reversing module 310 may be placed. This internal cavity is maintained moisture-free by the hub section 304. An electrical channel 308 transports current from the solar panels to the polarity-reversing module 310. Under a preferred embodiment of the present invention, the electrical channel 308 comprises a conductive wire encased within the composite plastic.

Figure 4:
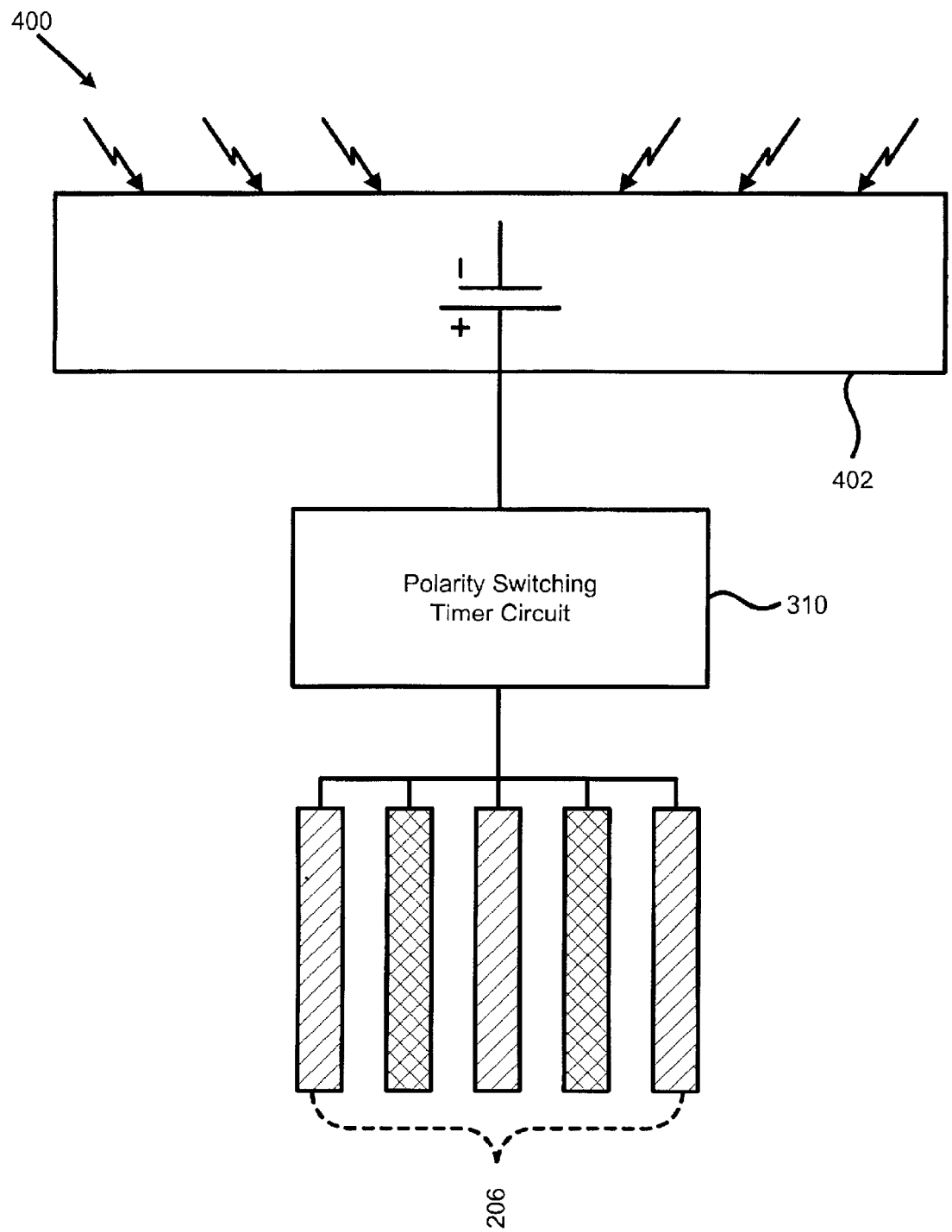
FIG. 4 is a schematic block diagram illustrating one embodiment of the configuration of the electronic circuitry of the present invention.

FIG. 4 is a schematic block diagram illustrating the electrical circuitry 400 of the sanitizing apparatus of the present invention. Under a preferred embodiment of the present invention, the electrical components 400 comprise a plurality of solar panels 402, the polarity-reversing module 310, and the plurality of electrodes 206. Solar energy captured by the solar panels 402 is transported to the polarity-reversing module 310. As stated above, the solar panels 402 may be replaced with any suitable alternate power source.

The polarity-reversing module 310 is preferably configured in such a way as to alternate the direction of the voltage applied to the individual electrodes of the plurality of electrodes 206 upon every passage of a selected interval of time. Such a polarity-reversing module 310 is easily fabricated by those skilled in the art of electronic circuit design. In one embodiment, the polarity-reversing module 310 is configured to reverse the polarity every 48 hours. Alternatively, the polarity-reversing module 310 may be configured to switch polarity at any suitable time interval, but preferably, not less than about one hour and not greater than about 72 hours. It has been found that reversing the polarity of the electrodes prevents build-up on the electrodes. By reversing the polarity of the electrode, cathodes are effectively made into anodes.

Figure 5:
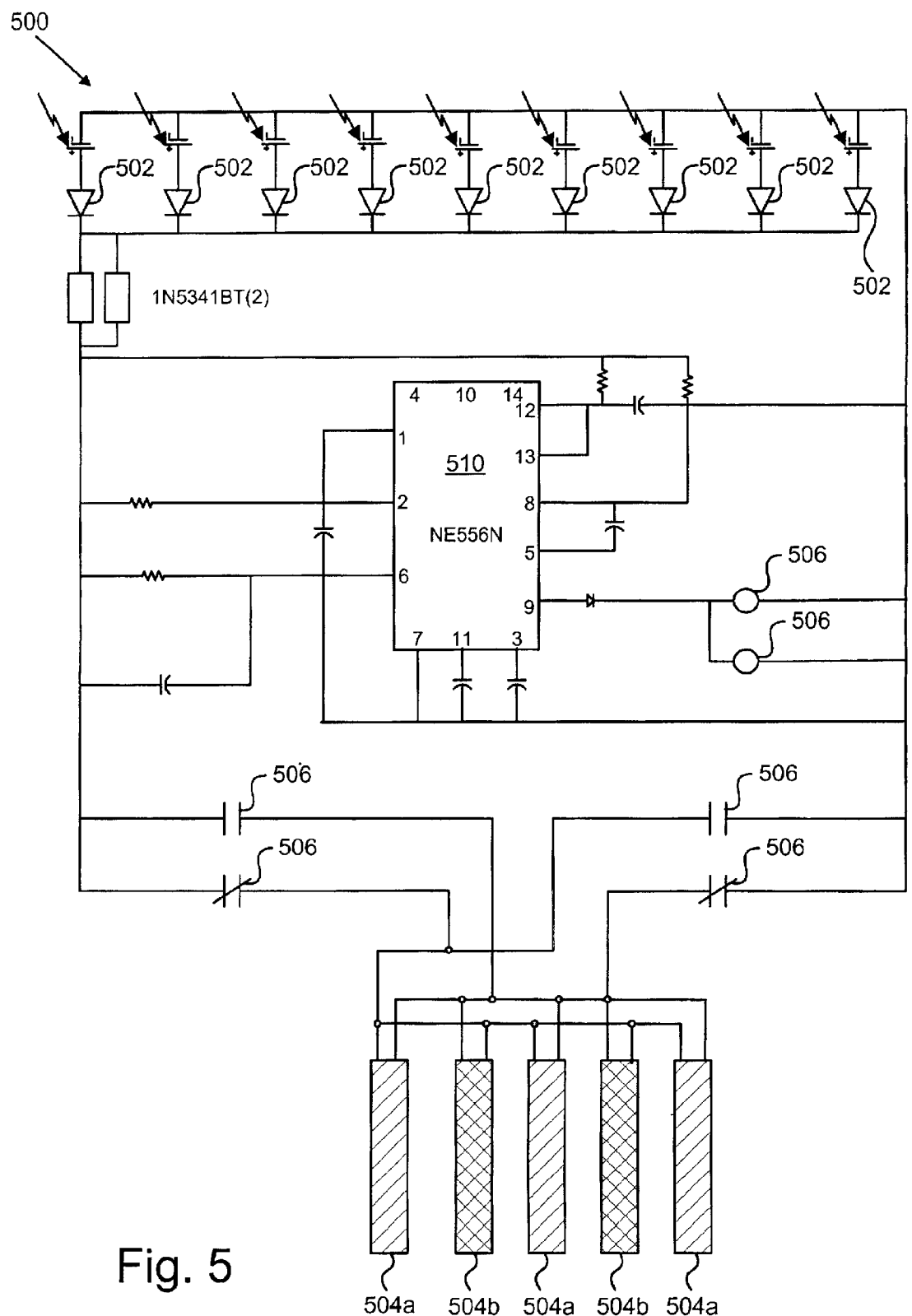
FIG. 5 is a schematic diagram illustrating a more specific example of the configuration of the polarity-reversing module of FIG. 4.

Shown in FIG. 5 is one example of a manner of implementing the electronic circuitry 500 of the present invention. A detailed description will not be made of each component of the circuit 500 as one skilled in the art will easily be able to calculate values for the separate components. The configuration of the circuit 500 is given herein by way of example and is not to be considered as limiting, as it is well within the abilities of those skilled in the art to modify the configuration while maintaining the purpose of the circuit.

Shown within the electronic circuit 500 are a plurality of diodes 502 and a plurality of electrodes 504. Also shown are a plurality of contact relays 506 and a timing circuit 510. The diodes are situated in such a way as to allow the current generated from the solar cells to travel in one direction only. This prevents solar cells that might not be in direct sunlight from drawing energy from those solar cells that are in direct sunlight. In this embodiment, each solar cell is electrically connected to a diode 502.

Under a preferred embodiment of the present invention, the electrodes 504 comprise sets of electrodes 504*a* and 504*b*. A set 504*a*, 504*b* may be made up of any number of electrodes. At any one time, each set of electrodes 504*a*, 504*b* functions as either anodes or cathodes, and the other set functions as the opposite. After the specified time interval discussed above, the timing circuit 310 causes the polarity applied to each set of electrodes 504*a*, 504*b* to be reversed, causing those electrodes 504*a*, 504*b* functioning as cathodes to be transformed into anodes, and vice verse. The contact relays 506 are electronic switches and are configured in the depicted embodiment to reverse the polarity of the electrodes 504 upon input from the timing circuit 510. Power then flows or is inhibited through the contact of these relays.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for the generation of sanitizing chemicals, the apparatus comprising:
    a buoyant enclosure configured to float freely on a body of water;
    a plurality of electrodes extending outward from the buoyant enclosure, the electrodes configured to generate chlorine from salt dissolved in water;
    a plurality of photovoltaic solar cells disposed on the buoyant enclosure, the plurality of photovoltaic solar cells configured to provide power to the electrodes;
    the plurality of photovoltaic solar cells disposed at an angle to the horizon when the buoyant enclosure is allowed to float in a body of water.

2. The apparatus of claim 1, wherein the buoyant enclosure comprises an upper buoyant housing and a lower buoyant housing disposed to one side of the upper buoyant housing.

3. The apparatus of claim 2, wherein the upper and lower buoyant housings comprise a floatable composite plastic material.

4. The apparatus of claim 1, further comprising a polarity reversing module electrically connected to the plurality of electrodes, the polarity reversing module configured to periodically alternate the electrical polarity of the electrodes, thereby preventing corrosion of the electrodes.

5. The apparatus of claim 4, wherein the polarity-reversing module is further configured to reverse the polarity of the electrodes at a selected time interval.

6. The apparatus of claim 4, wherein the polarity-reversing module comprises a timing circuit configured to provide an input to a plurality of contact relays to reverse the polarity applied to the plurality of electrodes at every occurrence of the selected time interval.

7. The apparatus of claim 6, wherein the selected time interval is in a range substantially between 1 to 24 hours.

8. The apparatus of claim 1, wherein the buoyant enclosure is configured with a polyhedrical shape.

9. The apparatus of claim 8, wherein the polyhedrical shape comprises a plurality of sides, wherein each side is set at a decline angle.

10. The apparatus of claim 9, wherein at least one photovoltaic solar cell is attached to each side.

11. The apparatus of claim 9, wherein the decline angle is configured to be substantially between 30° and 45°.

12. The apparatus of claim 1, wherein the buoyant enclosure comprises at least one central photovoltaic solar cell disposed in a substantially flat position on the buoyant enclosure, the at least one central photovoltaic solar cell located amid the plurality of photovoltaic solar cells disposed at a decline angle on the buoyant enclosure.

13. The apparatus of claim 1, wherein the plurality of electrodes comprises at least three electrodes configured to include at least two outer electrodes and at least one center electrode, the at least one center electrode configured to be bipolar.

14. The apparatus of claim 1, further comprising an oxidizer coating on each electrode, the oxidizer coating configured to resist the formation of scale on the electrodes and prevent corrosion of the electrodes.

15. An apparatus for the generation of sanitizing chemicals, the apparatus comprising:
    a buoyant enclosure configured to float freely on a body of water;
    a plurality of electrodes extending outward from the buoyant enclosure, the electrodes configured to generate chlorine from salt dissolved in water;
    a power source configured to transmit power to the plurality of electrodes; and
    an oxidizer coating on each electrode, the oxidizer coating configured to resist the formation of chemical accumulation on the electrodes and prevent corrosion of the electrodes.

16. The apparatus of claim 15, wherein the power source comprises a replaceable power supply.

17. The apparatus of claim 15, wherein the power source comprises a renewable power supply.

18. The apparatus of claim 17, wherein the renewable power supply comprises a photovoltaic solar panel.

19. The apparatus of claim 17, wherein the renewable power supply comprises a plurality of photovoltaic solar panels.

20. The apparatus of claim 19, wherein the plurality of photovoltaic solar panels comprise a centrally situated solar panel and a plurality of side solar panels, one situated on each side of a polyhedron-shaped buoyant enclosure.

21. The apparatus of claim 15, wherein the oxidizer coating comprises platinum.

* * * * *